(12) United States Patent
Dubey et al.

(10) Patent No.: US 6,446,818 B1
(45) Date of Patent: Sep. 10, 2002

(54) BOAT FOR CLEANING BALL GRID ARRAY PACKAGES

(75) Inventors: Ajit M. Dubey, Sunnyvale; Raj N. Master, San Jose, both of CA (US); Ot Ong; C S Chan, both of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 142 days.

(21) Appl. No.: 09/636,515

(22) Filed: Aug. 10, 2000

Related U.S. Application Data
(60) Provisional application No. 60/214,851, filed on Jun. 28, 2000.

(51) Int. Cl.[7] .................................................. A47F 7/00
(52) U.S. Cl. .................... 211/41.18; 206/722; 206/725; 206/564; 206/134; 206/72
(58) Field of Search ................. 211/41.18; 206/725, 206/722, 564; 134/72

(56) References Cited

U.S. PATENT DOCUMENTS

| | | | | |
|---|---|---|---|---|
| 5,766,978 A | * | 6/1998 | Johnson | |
| 5,794,783 A | * | 8/1998 | Carter | 206/725 |
| 5,794,784 A | * | 8/1998 | Murphy | 206/725 |
| 6,112,795 A | * | 9/2000 | Emmett et al. | |
| 6,116,427 A | * | 9/2000 | Wu et al. | 206/722 X |
| 6,227,372 B1 | * | 5/2001 | Thomas et al. | 206/725 |
| 6,230,896 B1 | * | 5/2001 | Lambert | 206/722 |
| 6,250,318 B1 | * | 6/2001 | Kiat et al. | 134/72 |
| 6,264,037 B1 | * | 7/2001 | Maston, III et al. | 206/725 |

* cited by examiner

Primary Examiner—Robert W. Gibson, Jr.

(57) ABSTRACT

A boat for cleaning semiconductor packages, including cleaning ball grid array packages in centrifugal cleaners. The boat includes a bottom plate with receptacles for receiving semiconductor packages and a top plate having through holes, where each through hole is smaller than the receptacle with which it corresponds in the bottom plate. An alignment mechanism ensures that the top plate is aligned with the bottom plate in a manner that results in each through hole being positioned directly over a respective one of the receptacles. An attachment mechanism releasably attaches the top plate to the bottom plate in a co-planar relationship that results in the presence of a vertical space between the two plates.

9 Claims, 2 Drawing Sheets

BOAT FOR CLEANING BALL GRID ARRAY PACKAGES

RELATED APPLICATIONS

This application claims priority from U.S. Provisional Patent Application Ser. No. 60/214,851, filed on Jun. 28, 2000, entitled: "Boat for Cleaning Ball Grid Array Packages", the entire disclosure of which is hereby incorporated by reference therein.

TECHNICAL FIELD

The present invention relates to the field of semiconductor manufacture, and more specifically to a boat for holding semiconductor packages during cleaning.

BACKGROUND ART

Semiconductor packages pass through a series of process steps and associated equipment during manufacturing. In order to maintain the integrity of the semiconductor packages, care must be used when handling and moving the semiconductor packages through each step in the manufacturing process and when transferring the semiconductor packages from manufacturing-related processes to shipping or distribution processes.

One aspect of semiconductor manufacturing involves a flux process, wherein solder connections are formed to join a semiconductor device to a support substrate and a device substrate package interconnection to an organic board. For example, the flux process can be implemented by heating a semiconductor assembly to solder temperature in the presence of solder flux. This will result in the formation of a solder bond. After heating, the semiconductor package is generally subject to a cooling cycle so that the solder hardens and the component parts are joined.

Through this heating and cooling process, residual flux deposits are formed on the exposed surfaces of the semiconductor package. In order to prevent semiconductor malfunction and to ensure proper package encapsulation, after completing the chip joining and other soldering processes during semiconductor package production, it is important that unwanted flux residue is removed from the semiconductor surfaces before subsequent assembly or shipping operations. This is accomplished by subjecting the semiconductor package to a cleaning operation.

Cleaning may also be necessary at other processing stages, such as when preparing surfaces for later processing, for removing other contaminants and debris, or for preparing a package before repair.

The cleaning operation used is generally determined by several factors. One factor is the process employed to assemble the semiconductor package. For example, a common cleaning operation involves the use of in-line cleaners that allow semiconductor packages to move uninterrupted directly from an assembly step, such as the flux process, to a cleaning step. This can be accomplished through automated mechanisms, such as robotics, which reduce or eliminate human intervention in the transfer process. In the alternative, it is possible to use centrifugal cleaners in order to remove flux residue and other contaminants from semiconductor packages.

Another factor affecting the choice of cleaning operation is the nature of the semiconductor package. In the case of packages with ball grid arrays, the cleaning operation selected is dictated in part by an interest in protecting the structure of the array. In particular, the packages must be cleaned and handled in a manner that prevents terminal balls on the package from coming into contact with any object that could dent, crush or otherwise damage them. The importance of ball grid array package handling is highlighted by the fact that the ball terminals have a low impact tolerance; they can be damaged with very little contact from other objects.

One way of protecting the semiconductor package during cleaning and associated handling is to place the package in a carrying device, such as a tray, cassette or boat, that is suitable both for the specific type of semiconductor package subject to cleaning and for the specific cleaner being employed.

Carrying devices typically have pockets that hold the semiconductor package. There may be one or more pockets in the carrying device. These carrying devices, alone or together with other carrying devices, may be placed directly in a cleaning apparatus or may be placed in a larger holding device, such as a tray holder, that is then placed in the cleaner.

The carrying devices conventionally available for cleaning ball grid array packages have been configured for use with in-line cleaners, which are common cleaning mechanisms used with ball grid arrays, particularly ceramic ball grid arrays. These carrying devices consist of a lidless, open-faced plate with pockets that are used to hold semiconductor packages.

Semiconductor package damage during cleaning and associated handling reflects the operating characteristics of in-line cleaners. For example, the cleaning function may cause horizontal semiconductor package movement within the carrying device that could scratch or dent the package, including ball terminals. Thus, the carrying devices that are used with these machines have support and containing features that are predominately focused on protecting the semiconductor packages from the kind of damage-causing behavior most commonly associated with in-line cleaners.

Currently, the same carrying devices used for in-line cleaners are also used in centrifugal cleaners, including the centrifugal cleaning systems made by Accel Corporation of Plano, Tex. However, due to the spinning mechanism inherent to centrifugal cleaners and the containment design of the in-line cleaner carrying devices, semiconductor packages often fly out of these carrying devices during cleaning and are subject to increased lateral and horizontal movement. To the extent that the semiconductor packages stay in the carrying devices normally used for in-line cleaners, the increased movement exposes the ball grid arrays on the bottom of the packages to increased damage potential by causing them to come into contact with other objects, including the bottom or sides of the carrying device.

Ball grad array packages continue to be popular due to their many benefits. For example, because of their small size, ball grid array packages offer significant savings in board real estate. Ball grid array packages also offer superior electrical performance because their shorter wirebond lengths help reduce inductance. Moreover, the solder ball pitch on a ball grid array package is very manageable during board assembly. Because of these and other positive features, new ball grid array packages are constantly being developed and demand for carrying devices and cleaning methods for these packages will continue to grow.

There exists a need for a carrying device, such as a boat, that will prevent semiconductor packages from falling out of the device during cleaning and that will hold semiconductor packages in place during cleaning in a manner that prevents damage to the packages.

There also exists a need for a method of cleaning semiconductor packages that will prevent the packages from falling out of a carrying device, such as a boat, during cleaning and that will allow the semiconductor packages to be held in place during cleaning so that the packages do not come into damaging contact with other objects.

SUMMARY OF THE INVENTION

These and other needs are met by the present invention, which provides a boat for semiconductor packages having a bottom plate with one or more receptacles for receiving semiconductor packages and a top plate having one or more through holes. Each through hole is smaller than the receptacle with which it corresponds in the bottom plate. An alignment mechanism ensures that the top plate is aligned with the bottom plate in a manner that results in each through hole being positioned directly over a respective one of the receptacles. An attachment mechanism releasably attaches the top plate to the bottom plate in a co-planar relationship that results in the formation of a vertical space between the two plates.

One of the advantages of the present invention is the prevention of movement by a package in a vertical direction during cleaning. This allows the boat to be used in both in-line cleaners and centrifugal cleaners.

The present invention also advantageously prevents packages from extending through the hole in the bottom of a receptacle. This permits the boat to be used with ball grid array packages because ball terminals on the underside of the package are protected from impact and damage during cleaning and associated handling.

Another aspect of the present invention provides a method for cleaning semiconductor packages. The method includes the steps of placing a semiconductor package in a receptacle in the bottom plate of a boat and securing the package in the boat by attaching the top plate over the bottom plate in an aligned position so that the through holes in the top plate correspond with the receptacles in the bottom plate.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

The present invention addresses and solves problems related to semiconductor packages falling out of a boat during cleaning. It also resolves problems associated with holding semiconductor packages in place during cleaning in a manner that prevents damaging package movement while the package is in the boat. The present invention protects semiconductor packages from damage by reducing or eliminating incidents where packages fall out of the boat during cleaning operations, particularly in centrifugal cleaners. The invention also limits undesirable horizontal and lateral package movement that, in conventional carrying devices, would bring the package into damaging contact with other objects during cleaning and associated handling. These benefits are achieved through the holding and retaining capabilities of the present invention and can be realized with different semiconductor package configurations placed in the invention, and particularly with packages having ball grid arrays (e.g., ceramic ball grid array packages).

The present invention is a boat having a bottom plate, a top plate, an alignment mechanism and attachment mechanism used to secure the top plate to the bottom plate during cleaning. An embodiment of the present invention is schematically illustrated in FIGS. 1–5, wherein similar features bear similar references.

Figure 1:
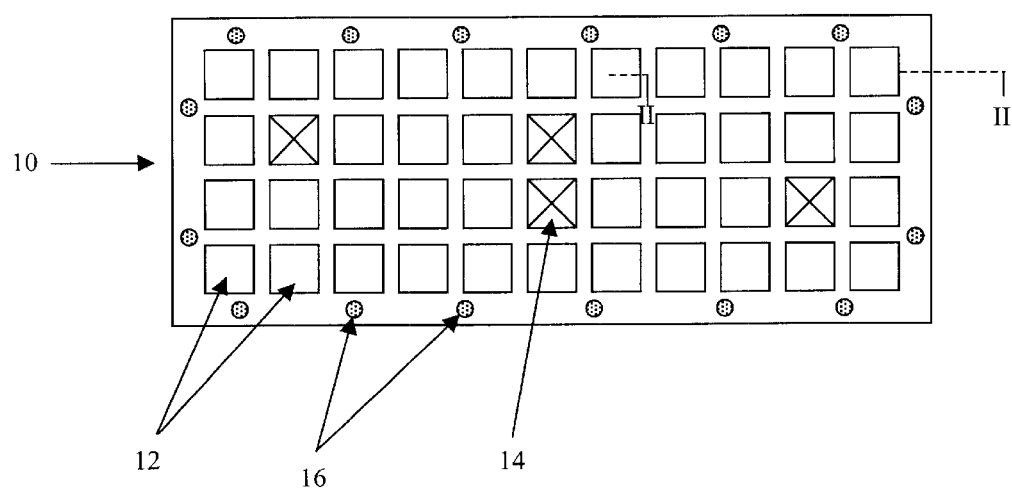
FIG. 1 is a top view of the bottom plate of a boat constructed in accordance with an embodiment of the present invention.

As illustrated in FIG. 1, a bottom plate 10 includes a plurality of receptacles 12 to hold semiconductor packages, wherein each receptacle 12 holds one package. The receptacles 12 are arranged in an array and spaced so that a package in one receptacle 12 will not come into contact with any other package placed in another receptacle 12, advantageously preventing package damage. The receptacles 12 are sized to allow a semiconductor package to be placed in and removed from a receptacle 12, while also limiting horizontal and lateral package movement within a receptacle 12 during cleaning and associated handling.

In an embodiment of the present invention depicted in FIG. 1, the bottom plate 10 is configured to include one or more blocked receptacles 14 as a substitute for one or more receptacles 12. These blocked receptacles 14 are positioned to mirror the blank pockets included in JEDEC shipping trays and can be located in alternative embodiments of the present invention to reflect different shipping tray configurations. These blocked receptacles 14 advantageously enables a manufacturer to easily move semiconductor packages from the present invention to a JEDEC shipping tray by flipping the packages from the bottom plate 10 to the shipping tray, thus beneficially reducing the amount of semiconductor package handling and improving transfer efficiency.

The bottom plate 10 further includes bore holes 16, which assist with the desired alignment and attachment of the components of the present invention.

Figure 2:
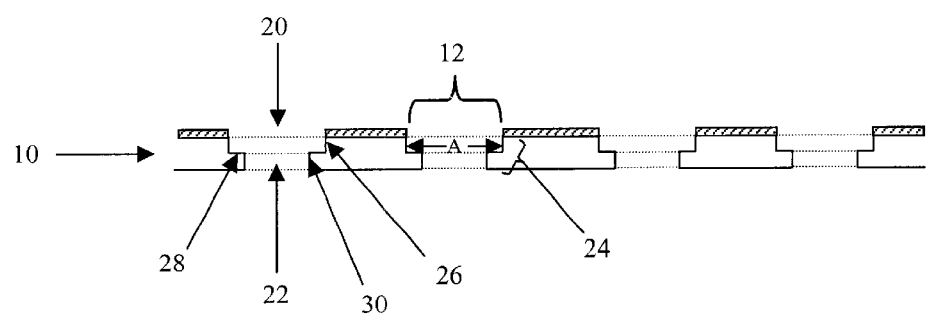
FIG. 2 depicts a cross-section of the bottom plate of the boat of FIG. 1, taken along line II—II.

The cross-section of FIG. 2 shows that the receptacles 12 have receptacle openings 20. These openings 20 allow semiconductor packages to be placed in the receptacles 12 of the bottom plate 10.

With continued reference to FIG. 2, the receptacles 12 have receptacle holes 22. These receptacle holes 22 improve cleaning effectiveness and productivity. For example, they prevent terminal balls on the underside of ball grid array packages from coming into undesirable contact with other objects during placement in, handling, cleaning or removal from the receptacles 12. The receptacle holes 22 also allow a cleaning composition to easily reach semiconductor package bottoms and to drain away during cleaning, thus improving residue and contaminant removal. Similarly, the receptacle holes 22 increase semiconductor package aeration, thereby reducing drying time following cleaning.

The receptacles 12 may be formed to include a step structure 24 in two or more inside walls in the illustrated exemplary embodiment. The step structure 24 of FIG. 2 includes an upper side 26, a package support surface 28 and a lower side 30. The height of the upper side 26 is sufficient to allow a top plate 40, later shown in FIG. 3, to be attached to the bottom plate 10 without coming into contact with a semiconductor package placed in any receptacle 12. The height of the lower side 30 is sufficient to ensure that no aspect of a semiconductor package extends beyond the receptacle hole 22. For example, where the semiconductor package includes a ball grid array, as with a ceramic ball grid array package, the package may be placed in the receptacle 12 so that the terminal balls are directed towards the receptacle hole 22. The height of the lower side 30 would be such that the terminal balls do not extend beyond the receptacle hole 22.

The distance A between opposing parallel step structures 24 is sufficient to allow a semiconductor package to be placed across the span created by the step structures 24 so that the parallel edges of the semiconductor package overlap and rest on the package support surfaces 28. This is depicted later in FIG. 4.

Figure 3:
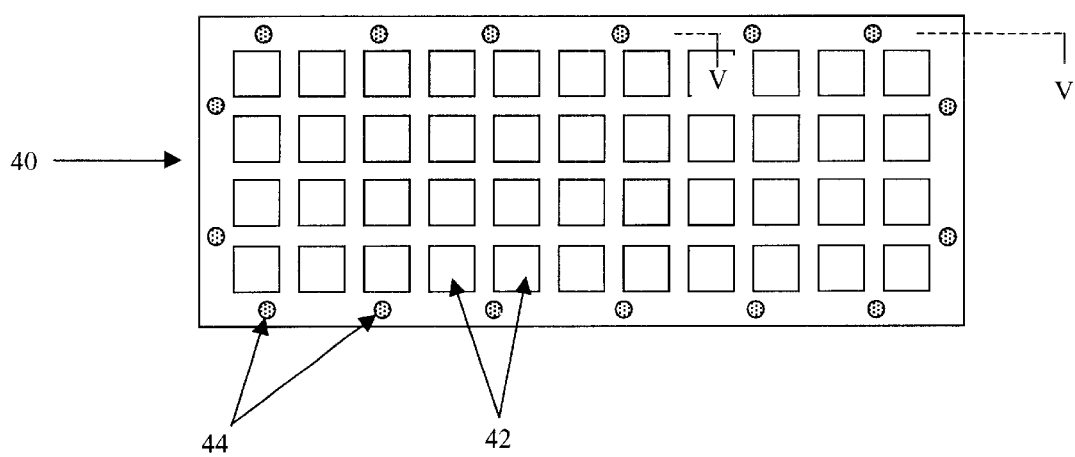
FIG. 3 is a plan view of a top plate of the boat in accordance with an embodiment of the present invention.

An embodiment of the present invention shown in FIG. 3 includes a top plate 40 that secures semiconductor packages in the receptacles 12 of the bottom plate 10 during cleaning and associated handling. The top plate 40 has a plurality of through holes 42 arranged in an array, where the position of each through hole 42 corresponds with the position of a respective receptacle 12. The top plate 40 further includes bore holes 44, which assist in aligning and attaching the bottom plate 10 to the top plate 40.

Figure 4:
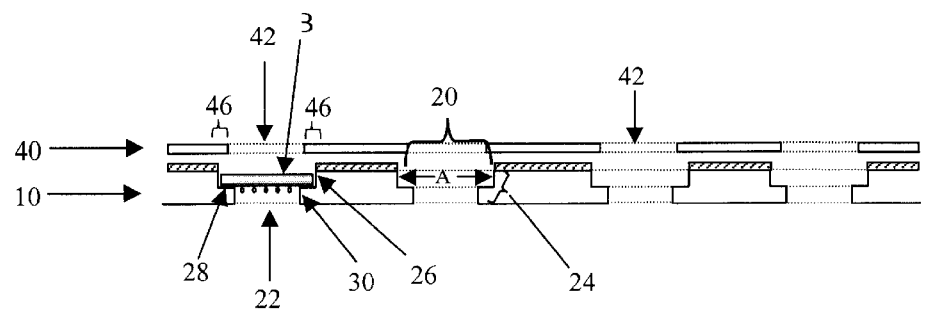
FIG. 4 is a side view of the top plate of FIG. 3 placed over the bottom plate of FIG. 1.

FIG. 4, which is a side view of the top plate 40 placed over the bottom plate 10, shows that the through holes 42 are sized to be smaller than the receptacle openings 20, as would be the case where the diagonal cross span of each through hole 42 is shorter than the diagonal cross span of each receptacle opening 20. This creates overhangs 46 that prevent a semiconductor package B from passing from the receptacle 12 through a through hole 42 during cleaning or associated handling.

Figure 5:
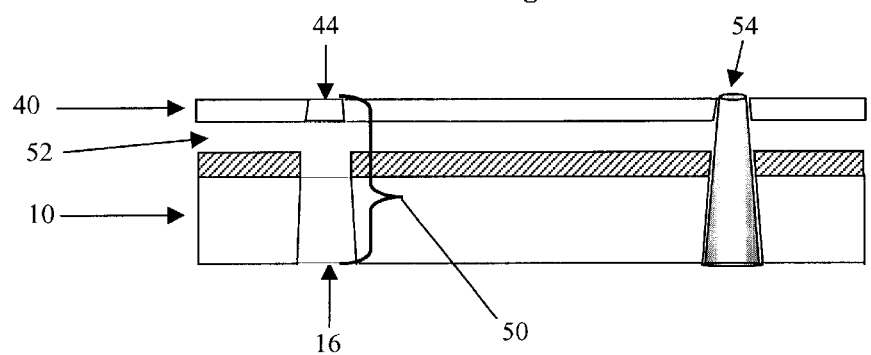
FIG. 5 illustrates a cross-section of a bore hole combination in the bottom and top plates of the boat, taken along line V—V, in accordance with an embodiment of the present invention.

As depicted in FIG. 5, which is a cross-section of FIG. 3 taken along line V—V, in order to ensure that the through holes 42 and receptacles 12 correspond with each other when the top plate 40 is placed over the bottom plate 10, bore holes 16 and 44 are located on each plate so that a bore hole 16 through the bottom plate 10 corresponds with a respective bore hole 44 through the top plate 40. When the top plate 40 is placed over the bottom plate 10, the bore holes 16 and 44 should be aligned to form a bore hole combination 50. This alignment is maintained during the cleaning and associated handling process by placing pins 54 through the bore hole combinations 50. Alignment can be achieved when at least two bore hole combinations 50 have a pin 54 placed through them.

The top plate 40 is secured to the bottom plate 10 so that when attached, the top plate 40 and bottom plate 10 are substantially parallel and in a co-planar position with a vertical space 52 between the two plates 40 and 10 that is less than the thickness of a semiconductor package B and sufficient to allow cleaning materials to pass over the semiconductor package B.

In FIG. 5, the pins 54 used to align the bottom plate 10 and top plate 40 are also the attachment mechanism used to releasably attach the two plates 10 and 40 during cleaning. The bore hole combination 50 is conically tapered and the pin 54 is correspondingly tapered so that when the pin 54 is placed through a bore hole combination 50, the bottom plate 10 is pushed down to the widest end of the pin 54, while the top plate 40 extends down the pin 54 enough to secure the top plate 40 to the bottom plate 10 while still maintaining the desired vertical space 52 between the two plates 10 and 40.

An embodiment of the present invention includes a boat made from a material, e.g., stainless steel. The boat of the present invention may comprise one or more materials and/or may comprise one or more layers of material. It will be appreciated that other materials suitable for forming relatively thin, sturdy structures can be used to form the boat.

The boat design allows semiconductor packages to be placed in the bottom plate receptacles in a manner that one of ordinary skill in the art believes will ensure optimal cleaning and protection of the package. For example, ball grid array packages may be placed in the receptacles so that the terminal balls on the underside of the package are facing the receptacle hole.

Moreover, one having ordinary skill in the art will appreciate that the present invention is not limited to boats for any particular semiconductor package style. Rather, in addition to accommodating ball grid array packages, the boat of the present invention may be configured to accommodate, for example, pin grid array packages. The inventive boat also may be configured to accommodate a single package as well as different packages with differing configurations.

The present invention also comprises a method of cleaning semiconductor packages. This method protects semiconductor packages, particularly ball grid array packages (e.g., ceramic ball grid array packages), from damage by reducing or eliminating incidents where packages fall out of the boat during cleaning operations in centrifugal cleaners or in-line cleaners and by limiting undesirable horizontal and lateral package movement during cleaning and associated handling.

In an embodiment of the present method, semiconductor packages are held in receptacles in a bottom plate of a boat. More specifically, the bottom plate includes a plurality of receptacles with openings configured to receive and hold semiconductor packages, wherein each receptacle holds one package and where the receptacles are arranged in an array and spaced so that a package in one receptacle will not come into contact with any other package placed in another receptacle. The packages, according to an embodiment of the method invention, are placed in receptacles with holes in the bottom that protect the package, particularly ball terminals on the underside of ball grid array packages, from coming into contact with the boat or other objects during placement in, handling, cleaning or removal from the boat receptacles and facilitate cleaning and drying.

Semiconductor packages may be placed in receptacles formed to include a step structure in two or more inside walls, where the step structure may include an upper side, a package support surface and a lower side. The dimensions of the step structure are sufficient to allow a semiconductor package to overlap and rest on the package support surfaces, to allow the top plate of the boat to be attached to the bottom plate without coming into contact with a package placed in any receptacle and to ensure that no aspect of the package extends beyond the receptacle hole.

Where the bottom plate of the boat is configured to include blocked receptacles that mirror blank pockets in JEDEC shipping trays, an embodiment of the method includes placing packages in the open receptacles while leaving the blocked receptacles free of packages.

Once the semiconductor packages are placed in the bottom plate receptacles, a top plate is placed over the bottom plate. The top plate has a plurality of through holes that are positioned to correspond with the position of a respective receptacle. These through holes are sized to be smaller than the receptacles, thereby creating overhangs that prevent a semiconductor package from passing through a through hole during cleaning or associated handling. The through holes and receptacles are properly positioned by ensuring that each top plate bore hole is aligned with a corresponding bottom plate bore hole to form a bore hole combination.

In an embodiment of the invention, the top and bottom plates are releasably attached with pins. The bore hole combinations through the top and bottom plates are conically tapered and the pins used are correspondingly tapered. A pin is placed through a tapered bore hole in the bottom plate, with the pin entering the bore hole from the bottom side of the bottom plate and running through the bore hole until the bottom plate is pushed down to the widest end of the pin. The top plate is then placed on the same pin so that the pin runs through the top plate bore hole that corresponds to the bottom plate bore hole. The top plate is pushed down the tapered pin enough to secure the top and bottom plates while still maintaining a vertical space between the two plates that is less than the thickness of a semiconductor package and sufficient to allow cleaning materials to pass over the packages. This step is repeated with additional pins and bore holes until one having ordinary skill in the art believes the plates are properly separated and secured.

After cleaning, the top plate is released from the bottom plate by removing the pins from the bore hole combinations. The semiconductor packages are then removed from the boat for completion of the assembly or shipping processes.

An advantage of the current invention is that it increases semiconductor package output by reducing the number of semiconductor packages damaged during cleaning, particularly when used in centrifugal cleaners to clean ball grid array packages (e.g., ceramic ball grid array packages). This improvement can be experienced by reducing the number of packages that fall out of the boat during cleaning. It can also result from the ability of the present invention to limit the amount of horizontal and lateral package movement in the receptacle during cleaning, which in turn protects the package, including any terminal balls, from damage that can arise when the package comes into undesired contact with the boat or other objects. Both of these advantages improve the percentage of semiconductor packages that pass through the cleaning process wholly intact.

The present invention also advantageously improves manufacturing efficiencies because the boat can be used with conventional extractor machines. As the semiconductor packages move from the assembly process to the cleaning process, extractor machines can take a semiconductor package from an assembly package carrier and place the package directly in the invented boat. This eliminates the human intervention commonly required to transfer semiconductor packages from the assembly process to the cleaning process, especially when centrifugal cleaners are used.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed:

1. A boat for holding semiconductor packages, comprising:
    a bottom plate having a plurality of receptacles with openings configured for receiving and holding individual semiconductor packages;
    a top plate having a plurality of through holes, each through hole corresponding to a respective one of the receptacles and having an opening that is smaller than the respective receptacle opening; and
    an attachment mechanism that releasably attaches the top plate to the bottom plate and positions the top plate with respect to the bottom plate such that each through hole is positioned directly over a respective one of the receptacles.

2. The boat according to claim 1, wherein the receptacles are arranged in an array so that each package placed in any one receptacle is in a non-contacting relationship with any other package placed in a receptacle on the same bottom plate.

3. The boat according to claim 2, wherein the receptacles have holes through their bottom surfaces.

4. The boat according to claim 3, wherein:
    two or more inside walls of each receptacle comprise a step structure; and
    each step structure including two parallel package support surfaces.

5. The boat according to claim 4, where the semiconductor package has a ball grid array, the step structure having:
    an upper side with a height sufficient to allow the top plate of the boat to be attached to the bottom plate without touching a ball grid array package placed in the receptacle; and
    a lower side with a height sufficient to allow a ball grid array package to rest on the package support surfaces with the package bottom facing downward without any part of the package extending below the receptacle hole.

6. The boat according to claim 1, wherein the boat comprises stainless steel.

7. The boat according to claim 1, having an alignment mechanism guiding the placement of the top plate over the bottom plate so that the bore holes through the top plate correspond with bore holes through the bottom plate.

8. The boat according to claim 1, having a releasable attachment mechanism comprising:
    bore holes through the top and bottom plates; and
    pins disposed within one or more bore holes through the bottom plate and the correspondingly aligned bore holes through the top plate.

9. The boat according to claim 8, wherein the pins are configured to engage the bore holes through the bottom and top plates so as to secure the bottom and top plates in a parallel co-planar position with a vertical space between the two plates that is less than the thickness of a package and sufficient to allow cleaning materials to pass over the surface of the semiconductor packages.

* * * * *